United States Patent [19]
DeCarlo

[11] Patent Number: 5,903,662
[45] Date of Patent: May 11, 1999

[54] AUTOMATED SYSTEM FOR PLACEMENT OF COMPONENTS

[75] Inventor: John M. DeCarlo, York, Me.

[73] Assignee: DCI Systems, Inc., Franklin, Mass.

[21] Appl. No.: 08/672,615

[22] Filed: Jun. 28, 1996

Related U.S. Application Data

[60] Provisional application No. 60/000,769, Jun. 30, 1995.

[51] Int. Cl.[6] .................................................. G06K 9/00
[52] U.S. Cl. ........................... 382/151; 382/145; 382/147
[58] Field of Search .................................... 382/145–151, 382/152–153; 364/468.01, 468.19, 468.28; 228/904, 170, 110, 4.5; 219/85.16, 78.02, 79; 250/230, 548; 356/401, 399

[56] References Cited

U.S. PATENT DOCUMENTS

| | | | |
|---|---|---|---|
| 4,514,858 | 4/1985 | Novak ........................................ | 378/34 |
| 4,899,921 | 2/1990 | Bendat et al. ........................... | 228/105 |
| 5,235,407 | 8/1993 | Spigarelli et al. ...................... | 356/399 |
| 5,396,334 | 3/1995 | Sugawara ............................... | 356/394 |
| 5,420,691 | 5/1995 | Kawaguchi ............................. | 356/375 |
| 5,457,538 | 10/1995 | Ujiie ....................................... | 356/399 |
| 5,519,496 | 5/1996 | Borgert et al. .......................... | 356/394 |
| 5,541,834 | 7/1996 | Tomigashi et al. ................. | 364/167.01 |

*Primary Examiner*—Leo H. Boudreau
*Assistant Examiner*—Duy M. Dang
*Attorney, Agent, or Firm*—Wolf, Greenfield & Sacks, P.C.

[57] ABSTRACT

Automated component placement apparatus includes a table for holding a board having a placement site, a placement head for holding a component to be placed on the placement site, an alignment assembly, a first actuator and a second actuator. The alignment assembly includes alignment optics for obtaining a first image of the component on the placement head and a second image of the placement site. The alignment assembly further includes an image processor for processing the first and second images to determine a relative position error between the component and the placement site and for providing a control signal representative of the position error. The first actuator causes relative movement between the placement head and the placement site, typically by movement of the placement head, in response to the control signal so as to correct the position error. The second actuator then moves the placement head between the alignment position and the placement position for placement of the component on the placement site. The placement head may include a bonding device for bonding the component or a group of components to the board.

39 Claims, 11 Drawing Sheets

5,903,662

AUTOMATED SYSTEM FOR PLACEMENT OF COMPONENTS

CROSS REFERENCE TO RELATED APPLICATION

This application claims the benefit of provisional application Ser. No. 60/000,769 filed Jun. 30, 1995.

FIELD OF THE INVENTION

This invention relates to apparatus for mounting components on printed circuit boards and, more particularly, to an automated system using image processing techniques for placing components, such as integrated circuits, on printed circuit boards with high accuracy.

BACKGROUND OF THE INVENTION

Advances in integrated circuit architecture and miniaturization have resulted in greater numbers of functions being incorporated on single chips, necessitating the use of chips with larger dimensions, increased lead density and/or reduced lead pitch. Fine pitch integrated circuit devices may have lead pitches (center-to-center spacing between leads) of 0.006 to 0.010 inch. For example, one package of the Pentium microprocessor has 322 leads. It is expected that integrated circuits will soon have up to 1,000 leads. The device must be aligned with a pattern of conductive pads on the printed circuit board to accuracies within 0.001 to 0.002 inch. A proposed integrated circuit package known as "flip chip" uses a pattern of ball contacts on the back surface of the integrated circuit package as input/output leads. The ball contacts may have diameters of 0.004 inch and a pitch of 0.008 inch. The ball contacts may cover all or a major portion of the rear surface of the integrated circuit package. Placement of the flip chip package on a printed circuit board is particularly difficult, because the ball contacts cannot be seen when the device is placed on the board.

Systems have been developed for automatic placement of integrated circuits on circuit boards. The trend in integrated circuit packaging to increased numbers of leads and decreased lead pitches, as well as the development of new integrated circuit packaging techniques, has imposed increased demands on integrated circuit placement systems. The need for increased accuracy has increased the cost of placement systems. Some prior art systems are unable to meet the placement requirements for newer integrated circuit packages.

A guidance-type placement apparatus, including an image acquisition/processing subsystem, for placing and mounting integrated circuit components or devices is disclosed in U.S. Pat. No. 5,235,407 issued Aug. 10, 1993 to Spigarelli et al. In the disclosed system, the image acquisition subsystem generates images of at least one pair of diagonally-opposed corners of the placement site and the IC device from the same optical perspective. Images generated by the image acquisition system provide feedback control to regulate the placement process to attain and verify lead-to-pad alignment.

SUMMARY OF THE INVENTION

According to the present invention, component placement apparatus and methods are provided. The component placement apparatus comprises a table for holding a board having a placement site, a placement head for holding a component to be placed on the placement site, an alignment assembly, a first actuator and a second actuator. The placement head is movable between an alignment position and a placement position. The alignment assembly comprises alignment optics for obtaining a first image of the component on the placement head and a second image of the placement site, and an optics position controller for moving at least a portion of the alignment optics between an operating position and a retracted position. The alignment assembly further comprises an image processor for processing the first and second images to determine a relative position error between the component and the placement site and for providing a control signal representative of the position error. The first actuator causes relative movement between the placement head and the placement site in response to the control signal so as to correct the position error. The second actuator then moves the placement head between the alignment position and the placement position for placement of the component.

In a first embodiment, the alignment optics comprises a camera for obtaining the first and second images, a beam splitter for permitting the camera to view the placement site and the component, a first lighting unit for illuminating the component and a second lighting unit for illuminating the placement site. In the first embodiment, each of the components of the alignment optics is movable between the operating position and the retracted position.

In a second embodiment, the alignment optics comprises movable optics, movable between the operating position and the retracted position and fixed optics. The fixed optics may include a high resolution video camera and a zoom lens. The movable optics may comprise a beam splitter, a first lighting unit for illuminating the component and a second lighting unit for illuminating the placement site.

The first actuator may include means for moving the placement head in X and Y directions parallel to a plane of the board and for rotating the placement head about an axis perpendicular to the plane of the board for alignment of the component with the placement site. Alternatively, the first actuator may move the board in X and Y directions and rotate the board for alignment of the component with the placement site.

In one embodiment, the lighting units may each comprise a light source for generating a light beam, a diffuser for diffusing the light beam and a beam splitter for directing the diffused light beam along a camera viewing path. In another embodiment, the first and second lighting units may each comprise a light source for directing a light beam at an acute angle with respect to a surface of the component or the placement site.

The placement head may include a bonding device for bonding the component to the board. In a first embodiment, the bonding device includes means for directing a heated gas toward the component for bonding. In a second embodiment, the bonding device may include means for generating infrared energy for bonding the component to the board. In a third embodiment, the bonding device may include means for contact heating of the component for bonding. The bonding device may bond a single component or may bond a group of components simultaneously.

According to another aspect of the invention, a method is provided for accurately placing a component on a board having a placement site for the component. The board is loaded onto a table, and the component is held by a placement head that is movable between an alignment position and a placement position. A first image of the component on the placement head and a second image of the placement site are obtained. The first and second images are processed to determine a relative position error between the component and the placement site, and a control signal representative of the position error is provided. The placement head or the board is moved in response to the control signal so as to correct the position error. The placement head is then moved between the alignment position and the placement position, and the component is released from the placement head.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
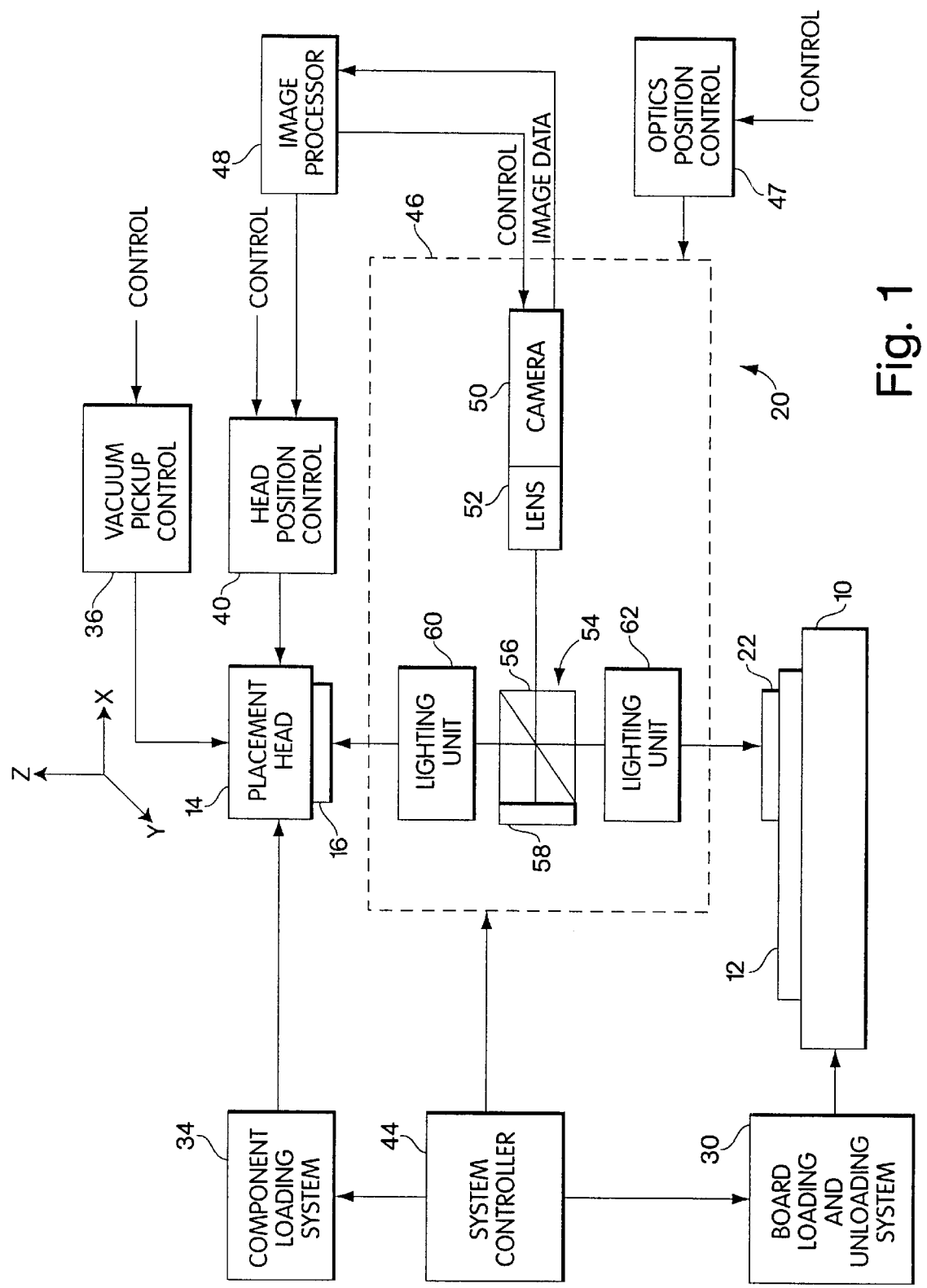
FIG. 1 is a block diagram of a first embodiment of an automated system for placement of components in accordance with the present invention.

A block diagram of a first embodiment of an automated system for placement of components in accordance with the present invention is shown in FIG. 1. The major components of the system include a table 10 for support of a printed circuit board 12 during a placement operation, a placement head 14 for accurately placing a component 16 on the printed circuit board 12 and optionally bonding the component 16 in place, and an alignment assembly 20 for sensing and controlling alignment between the component 16 and a placement site 22 on the printed circuit board 12. The placement site 22 is typically a pattern of conductive pads which correspond to the leads on the component 16.

A board loading and unloading system 30 places board 12 in a predetermined position on table 10 at the beginning of the placement operation and unloads the board 12 after the placement operation has been completed. Any suitable board loading and unloading system 30 can be utilized. Examples include conveyors and manual systems. In the example shown in FIG. 1, the table 10 is in a fixed position during the placement procedure.

A component loading system 34 provides components for placement on printed circuit board 12 one at a time. The component loading system 34 may bring the component 16 to a predetermined position. The placement head 14 is moved into alignment with the predetermined position, and the component is lifted with a vacuum pickup device. A vacuum pickup control 36 connected to placement head 14 controls the activation and deactivation of the vacuum pickup device. Any suitable component loading system 34 can be utilized. Examples include component trim/form/ excise systems, matrix tray systems and tape feed systems.

A head position control 40 controls the position of the placement head 14 with four degrees of freedom. An X, Y, Z coordinate system is illustrated in FIG. 1. The X and Y axes are parallel to the plane of printed circuit board 12, and the Z axis is perpendicular to the plane of printed circuit board 12. The head position control 40 includes suitable motors or other actuators for controllably moving the placement head 14 in the X, Y and Z directions. In addition, the head position control 40 includes a motor or actuator for rotating the component 16 by an angle $\theta$ about an axis parallel to the Z axis. More particularly, the movements of the placement head 14 are as follows. The placement head 14 is movable as required in the X, Y and Z directions for pickup of component 16 from the component loading system 34. In addition, placement head 14 is movable in the X, Y and $\theta$ directions for alignment of component 16 with placement site 22. Finally, the placement head 14 is movable in the Z direction and, if necessary, in the X and Y directions for placement of the component 16 on the placement site 22 of the printed circuit board 12. It should be noted that the placement head 14 is not necessarily located directly above the placement site 22. All that is required is that the placement head follow a known, repeatable path between the location where alignment is performed and the placement site 22 on the printed circuit board 12.

In one embodiment, the head position control 40 utilizes lead screw drives for moving the placement head 14 in the X, Y and Z directions, and a rotation motor and a ball reducer for rotating the placement head 14. In another embodiment, linear motors may be used for moving the placement head 14 in the X, Y and Z directions. In yet another embodiment, Sawyer motors may be used for moving the placement head in the X and Y directions. A further embodiment suitable for use of Sawyer motors is described below.

A system controller 44 controls the components of the placement system, including the alignment assembly 20, the board loading and unloading system 30, the component loading system 34, the vacuum pickup control 36 and the head position control 40, to perform the operations described below. The system controller 44 may be a general purpose computer or microprocessor, or a special purpose controller.

As noted above, the placement head 14 may optionally include a device for bonding the component 16 to the printed circuit board 12 at the placement site 22. More particularly, the leads of the component 16 may be bonded to the respective pads on the printed circuit board by soldering. In one example, the bonding device includes a manifold for directing jets of hot gas at the component leads for bonding. In another example, the bonding device uses infrared heating of the component leads. In yet another example, the bonding device uses contact heating of the component leads. Combinations of these techniques may be used. Any suitable bonding device is included within the scope of the present invention. The bonding device may separately bond each component to the printed circuit board 12 after it is placed on the board. In another approach, the system may first place a group of components on the board, one at a time, and then the bonding device may bond the group of components to the board simultaneously. This approach saves time and reduces thermal stress to the printed circuit board and the components. In yet another approach, the placement head 14 may not be provided with a device for bonding the component 16 to the printed circuit board 12. In this case, bonding is performed as a separate operation by other equipment.

The alignment assembly 20 includes alignment optics 46, optics position control 47 for moving alignment optics 46 between an operating position and a retracted position, and an image processor 48 coupled between the alignment optics 46 and the head position control 40. The alignment optics 46 includes at least one imaging device, such as a video camera 50, including a lens 52, directed at a beam splitter 54. In the example of FIG. 1, the beam splitter 54 includes a prism 56 and a mirror 58. The mirror 58 is affixed to the prism 56 with its reflective surface facing camera 50. The beam splitter 54 is positioned during the alignment process between component 16 and placement site 22 on the printed circuit board 12. The beam splitter 54 is designed to permit the camera 50 to view the component 16 or the placement site 22 on printed circuit board 12. A lighting unit 60 illuminates component 16, and a lighting unit 62 illuminates placement site 22 on printed circuit board 12. As described below, the camera 50 obtains images of the printed circuit board 12 and the component 16 in sequence. The camera 50 may be any video camera of suitable size and resolution. In one example, a miniature CCD camera manufactured by Toshiba is used. As shown in FIG. 1, a portion of alignment optics 46 is positioned between the component 16 on placement head 14 and placement site 22 when the images of the component 16 and the placement site 22 are obtained. The images of the component 16 and the placement site 22 are obtained in opposite directions relative to the portion of alignment optics 46 that is positioned between component 16 and placement site 22.

The optics position control 47 controls the position of the alignment optics 46. In particular, the alignment optics 46 is positioned for viewing placement site 22 on printed circuit board 12 and for viewing component 16. The operating position of the alignment optics 46 is shown in FIG. 1. The component 16 and the placement site 22 are located within the field of view of the alignment optics 46 when the alignment optics 46 is in the operating position. After the alignment procedure is complete, the alignment optics 46 is moved away from the board 12 and the placement head 14 to the retracted position, so that the component 16 may be placed on the board.

Figure 2:
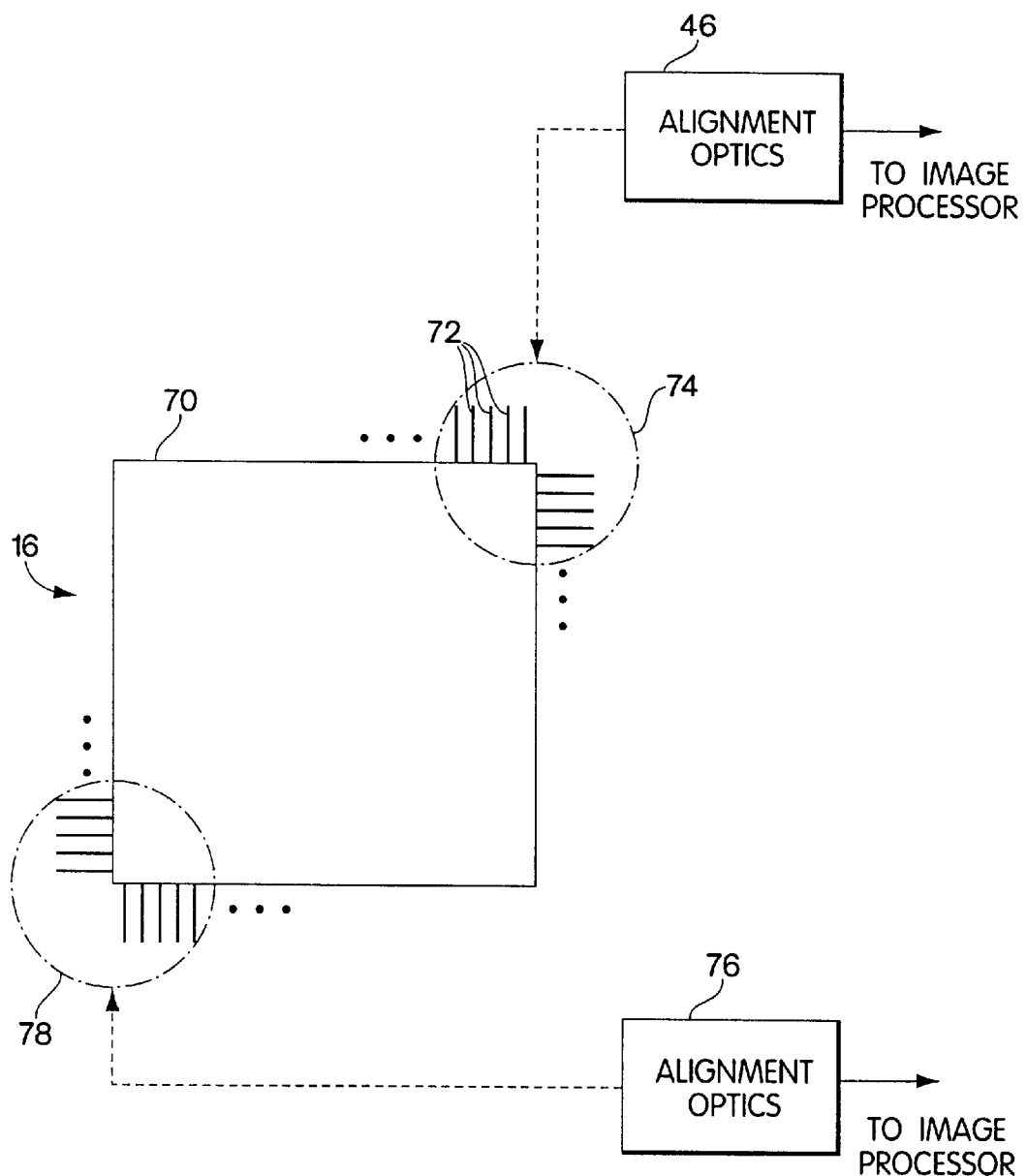
FIG. 2 is a simplified representation of an integrated circuit package, illustrating regions at diagonally opposite corners of the package viewed by the cameras of the alignment assembly.

The alignment optics 46 shown in FIG. 1 includes a single camera 50, beam splitter 54 and lighting units 60 and 62. Depending on the required accuracy and the resolution of the camera 50, a single camera system may be utilized. Alternatively, the alignment optics may include two or more cameras and associated optics for increased accuracy. Use of two or more cameras permits selected areas of the component 16 and the placement site 22 to be viewed with high resolution. In one configuration, two cameras and associated optics are utilized. Referring to FIG. 2, an integrated circuit 70 having multiple leads 72 is shown. Alignment optics 46, configured as shown in FIG. 1, is positioned for obtaining an image of a viewing region 74 at one corner of integrated circuit 70. Alignment optics 76, having a configuration identical to alignment optics 46, is positioned for obtaining an image of a viewing region 78 of integrated circuit 70. The viewing regions 74 and 78 preferably include a selected number of leads 72 at or near diagonally opposite corners of the integrated circuit 70. Viewing regions on the placement site 22 correspond to the viewing regions 74 and 78 on the integrated circuit 70. Alignment optics 46 and 76 each provide image data representative of images of the respective regions 74 and 78 to image processor 48. The alignment optics 46 and 76, in a similar manner, obtain images of the corresponding viewing regions at diagonally opposite corners of the placement site 22.

The images of the component 16 are compared by the image processor 48 with the images of the placement site 22 to obtain a measure of the position offset therebetween. In particular, the image processor 48 determines position offset errors between the leads on component 16 and the corresponding pads at placement site 22 in terms of X and Y displacements and rotation angle $\theta$. The image processor 48 provides control signals representative of X, Y and $\theta$ offset errors to the head position control 40 for displacing and rotating the placement head 14, such that the component 16 is brought into alignment with placement site 22. An advantage of the alignment technique described herein is that fiducial marks are not required on the printed circuit board 12 for alignment. Image processing techniques for determining the displacement and rotation of corresponding elements in two images, such as the leads on integrated circuit 70 and bonding pads at placement site 22, are known to those skilled in the art. The image processor 48 typically includes a frame grabber and a computer. The computer may be the system controller 44 computer or may be a separate vision processor.

Figure 3:
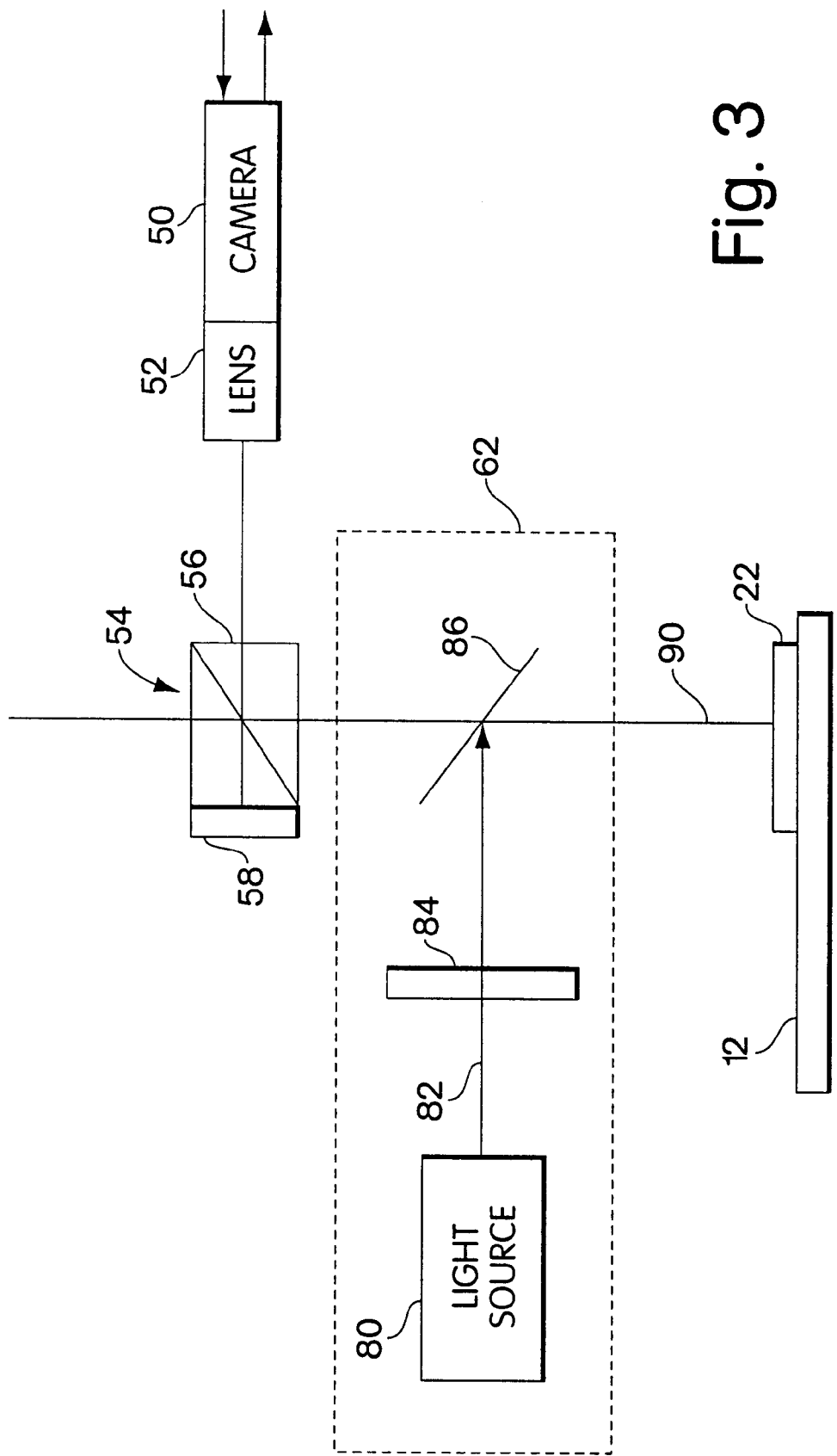
FIG. 3 is a block diagram of a portion of the alignment assembly, showing a first embodiment of the lighting unit.

A block diagram of a portion of the alignment optics 46, illustrating a first embodiment of the lighting unit 62, is shown in FIG. 3. A light source 80, such as a light emitting diode, directs a beam 82 through a diffuser 84 to form a diffuse light beam that is incident on a beam splitter 86. The beam splitter 86 directs the diffuse light beam along a path 90 to placement site 22 on printed circuit board 12 for illumination thereof. The light is reflected by placement site 22 along path 90 through beam splitter 86 to beam splitter 54. The beam splitter 54 directs the reflected light to lens 52 and camera 50 for obtaining an image of placement site 22. Thus, the lighting unit 62 provides diffuse, on-axis illumination of the placement site 22. The lighting unit 60 preferably has the same configuration as the lighting unit 62. The lighting unit illustrated in FIG. 3, which utilizes perpendicular diffuse illumination, is advantageous for illumination of printed circuit boards that may have flux or other coatings that could cause a specular reflection and interfere with obtaining an image of the placement site 22. Other lighting configurations can be used within the scope of the present invention. For example, in other applications off-axis, direct illumination of the printed circuit board and the component may be desirable. In one embodiment, the light source 80 is a light emitting diode having an output wavelength centered at 660 nanometers. Use of narrow band illumination may be desirable to reduce the effects of ambient light on the operation of the alignment optics. In this case, optical filters are used to attenuate light outside the illumination band. However, broad band illumination, including white light, can be utilized for illumination within the scope of the present invention.

In operation, printed circuit board 12 is loaded onto table 10 by board loading and unloading system 30. Placement head 14 picks up component 16 from component loading system 34. The component 16 is retained on the placement head 14 by activation of the vacuum pickup control 36. The alignment optics 46 and 76 are moved by optics position control 47 into alignment with placement site 22 on printed circuit board 12. The lighting unit 62 associated with each camera is energized, and the camera 50 obtains an image of the placement site 22. When the alignment system includes two cameras as discussed above in connection with FIG. 2, alignment optics 46 and 76 may obtain images of diagonally opposite corners of the placement site with high resolution. The image data for the placement site is forwarded to the image processor 48, and the lighting unit 62 is deenergized. The lighting unit 60 associated with each camera is energized, and an image of the component 16 is obtained by camera 50. When the alignment system includes two cameras as described in connection with FIG. 2, alignment optics 46 and 76 provide images of regions 74 and 78 at diagonally opposite corners of the component 16. The image data is supplied to the image processor 48.

The image processor 48 processes the image data representative of the placement site 22 and the component 16 and determines X, Y and θ offset errors. Signals representative of the offset errors are supplied to the head position control unit 40 to displace and rotate the component 16 into alignment with placement site 22. If desired, the alignment can be rechecked by obtaining new images of the placement site 22 and the component 16 and processing the image data to determine any remaining offset errors.

After the desired alignment between the component 16 and the placement site 22 has been achieved, the alignment optics 46 and 76 are moved by the optics position control 47 out of the path between placement head 14 and printed circuit board 12. Then the placement head 14 is moved along a known, repeatable path so that the component 16 is positioned on the placement site 22 with the desired alignment. Typically, placement head 14 is moved downwardly along a vertical path to the placement site 22. However, as noted above, predetermined X and Y displacements can be part of the movement of the placement head to the placement site 22. When the component 16 is positioned on the placement site 22, an optional bonding procedure can be initiated. For example, gas jets can be directed through a manifold to the leads of the integrated circuit to bond the leads to the pads on the printed circuit board 12, thus completing the placement and bonding procedure.

The alignment optics 46 and 76, and the optics position control 47 may be mounted to and move with the placement head 14. In this configuration, the optics position control 47 moves the alignment optics 46 and 76 with respect to the placement head 14. In an alternative configuration, the alignment optics 46 and 76 and the optics position control 47 are independent of the placement head 14. This configuration uses a movable placement head and a separate, independently movable alignment optics head. Sawyer motors may be particularly suitable for moving the two heads in the X and Y directions in this configuration. An advantage of this configuration is that the alignment optics may be positioned for obtaining an image of the placement site at the same time that the placement head is picking up a component from the component loading system, thus reducing the time for the alignment and placement operation.

Figure 4:
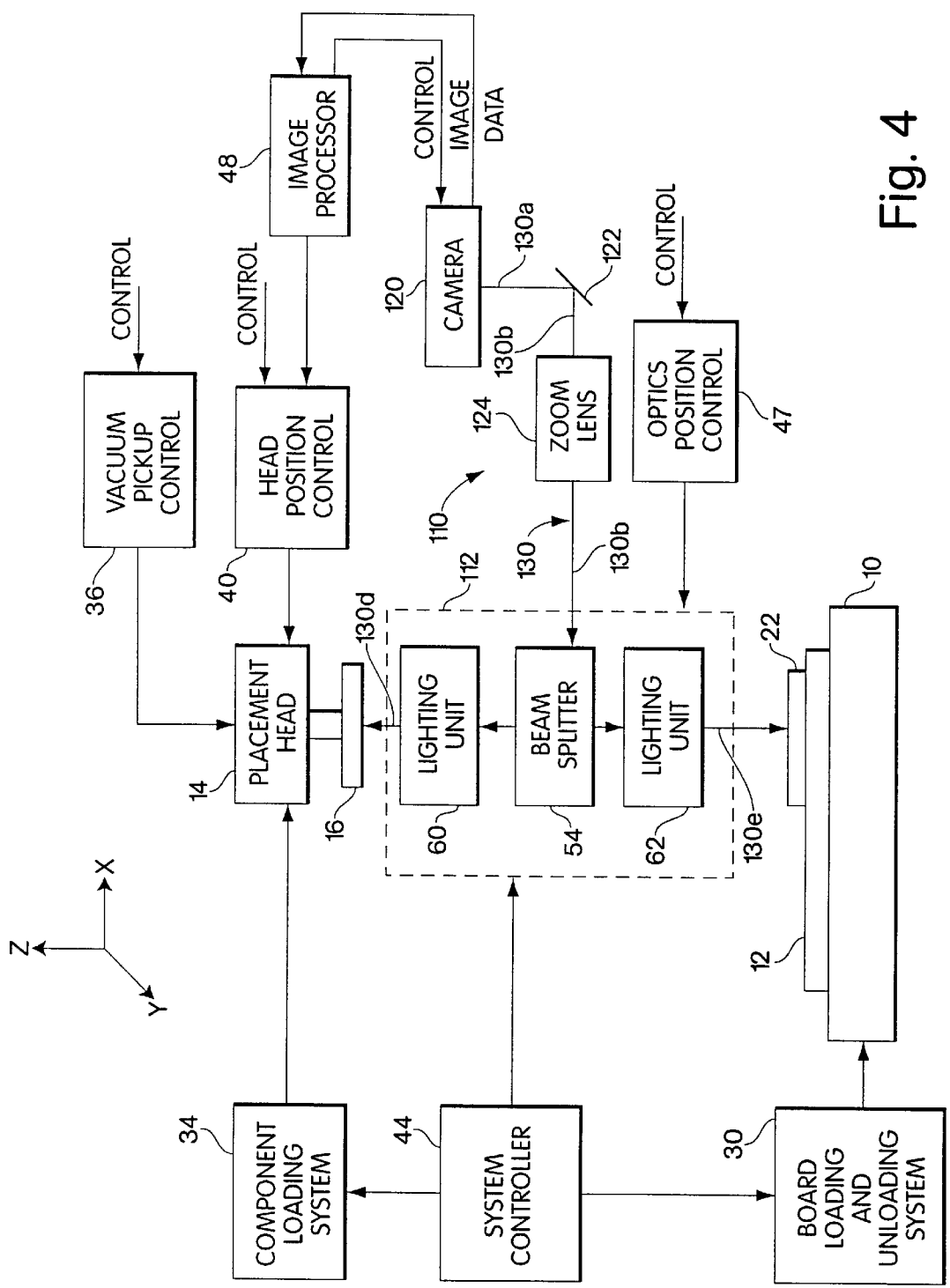
FIG. 4 is a block diagram of a second embodiment of an automated system for placement of components in accordance with the present invention.
Figure 5:
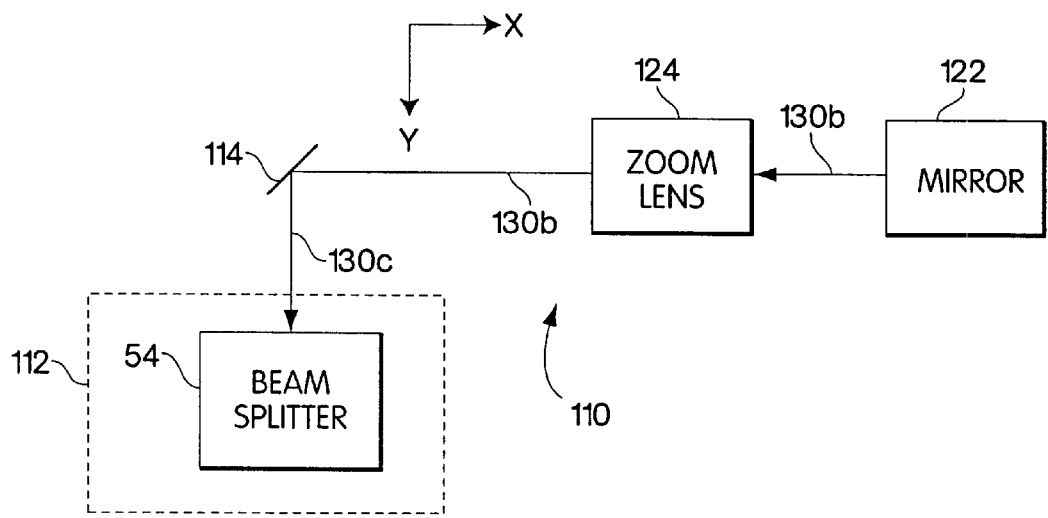
FIG. 5 is a block diagram showing a top view of a portion of the alignment assembly in the automated component placement system of FIG. 4.

A block diagram of a second embodiment of an automated system for placement of components in accordance with the present invention is shown in FIG. 4. Like elements in FIGS. 1 and 4 have the same reference numerals. The embodiment of FIG. 4 differs from the embodiment of FIG. 1 primarily in the configuration of the alignment optics. Alignment optics 110 operates with image processor 48 and optics position control 47 in the system of FIG. 4. The alignment optics 110 includes movable optics 112 and fixed optics. The fixed optics includes camera 120, a mirror 122, a zoom lens 124 and a mirror 114 (FIG.5). A partial top view of the alignment assembly 110 is shown in FIG. 5 to illustrate the three dimensional optical path utilized. Movable optics 112, which is movable relative to placement head 14, includes beam splitter 54 and lighting units 60 and 62. Camera 120 views component 16 and placement site 22 (at different times) along an optical path 130 including a segment 130a that is parallel to the Z-axis between camera 120 and mirror 122, a segment 130b that is parallel to the X-axis between mirror 122 and zoom lens 124 and between zoom lens 124 and mirror 114, a segment 130c that is parallel to the Y-axis between mirror 114 and beam splitter 54, and segments that are parallel to the Z-axis between beam splitter 54 and component 16 (segment 130d) or placement site 22 (segment 130e). This configuration provides a relatively compact construction, while accommodating the relatively long optical path required for operation of the zoom lens 124. The optical path between the camera 120 and component 16 and placement site 22 is shrouded to prevent interference by ambient light. In a preferred embodiment, the camera 120 has high resolution and may be a type 1.4 1 or 4.0 1 manufactured by Eastman Kodak and the zoom lens 124 may be manufactured by Unitron. The use of a high resolution camera permits viewing of the entire component with a single camera with acceptable resolution. Thus, with reference to FIG. 2, the entire area of integrated circuit 70 may be viewed with acceptable resolution. The zoom lens 124 can be operated to obtain images of different size components or selected viewing regions of components.

Figure 6:
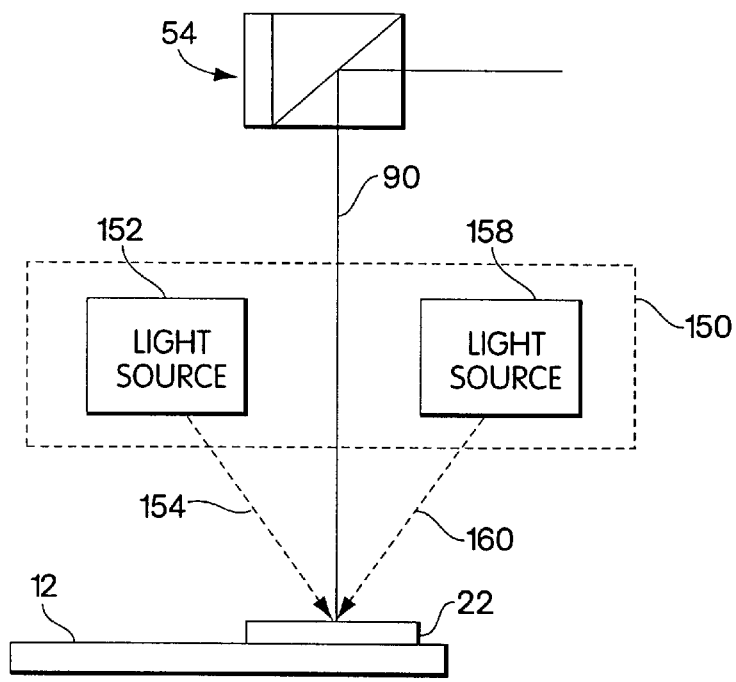
FIG. 6 is a block diagram of a portion of the alignment assembly, showing a second embodiment of the lighting unit.

A second embodiment of a lighting unit for illumination of placement site 22 and component 16 is shown in FIG. 6. Like elements in FIGS. 1, 3 and 6 have the same reference numerals. A lighting unit 150 includes a light source 152, such as a light-emitting diode, displaced with respect to path 90 along which placement site 22 is viewed by the camera 50 or 120. The light source 152 directs a light beam 154 at placement site 22 at an acute angle with respect to the surface of placement site 22. An optional light source 158 may be used to direct a light beam 160 at placement site 22 from a different direction. The lighting unit 150 shown in FIG. 6 is advantageous in illuminating a contoured surface, such as for example, the ball contacts on the back surface of a flip-chip integrated circuit package. Such illumination produces better contrast in the image obtained by the camera. A lighting unit of the type shown in FIG. 3 and described above is preferred where the surface being imaged is relatively flat. A lighting unit 62 of the type shown in FIG. 3 or a lighting unit 150 of the type shown in FIG. 6 may be used for implementation of the lighting units 60 and 62 shown in FIGS. 1 and 4. Furthermore, diffuse lighting and direct lighting may be combined in a single lighting unit, and either or both types of illumination may be utilized in a particular application.

The automated component placement system of the present invention, as shown in FIGS. 1–6 and described above, permits high accuracy placement of components without placing excessive accuracy requirements on the elements of the system. In particular, the alignment assembly obtains an image of the component and an image of the placement site sequentially, using a single camera. (Although an embodiment utilizing two cameras is disclosed herein, each camera obtains two images sequentially, including an image of a selected region of the component and an image of a corresponding region of the placement site.) The image processor determines a relative position error between the component and the placement site, rather than an absolute position error of the component relative to the system, as in prior art systems. After the relative position error is determined, the placement head is displaced and rotated as necessary to eliminate the position error to the extent possible. Then, the placement head places the component on the placement site with high accuracy. The path of the placement head between the alignment position and the placement position must be repeatable. Furthermore, the optical path of the alignment optics must be stable relative to the Z-axis of the system. However, absolute position accuracy relative to the table is not required.

A further feature of the automated component placement system is the ability to verify position adjustment. Thus, after the position error of the component has been corrected by any X, Y and θ movements that are necessary, second images of the component and the placement site may be obtained. The relative position error between the component and the placement site is determined a second time to verify the position correction procedure. If necessary, the component can be moved in X, Y and θ to further reduce position error.

As is apparent from FIGS. 1 and 4, the alignment optics of the automated component placement system may have different configurations within the scope of the present invention. In the embodiment of FIG. 1, the alignment optics 46 is mounted to placement head 14 and is movable with placement head 14 under control of head position control 40. Alignment optics 46, including camera 50, lens 52, lighting units 60 and 62 and beam splitter 54, is movable relative to placement head 14 under control of optics position control 47 between an operating position as shown in FIG. 1 and a retracted position in which alignment optics 46 does not interfere with downward movement of placement head 14 to placement site 22.

In the embodiment of FIG. 4, the alignment optics 110 may be mounted to placement head 14. However, alignment optics 110 includes movable optics 112 and fixed optics, including camera 120, mirrors 114 and 122 and zoom lens 124. The alignment optics 110 is movable with placement head 14 under control of head position control 40. The movable optics 112 is movable relative to placement head 14 under control of optics position control 47.

Figure 7:
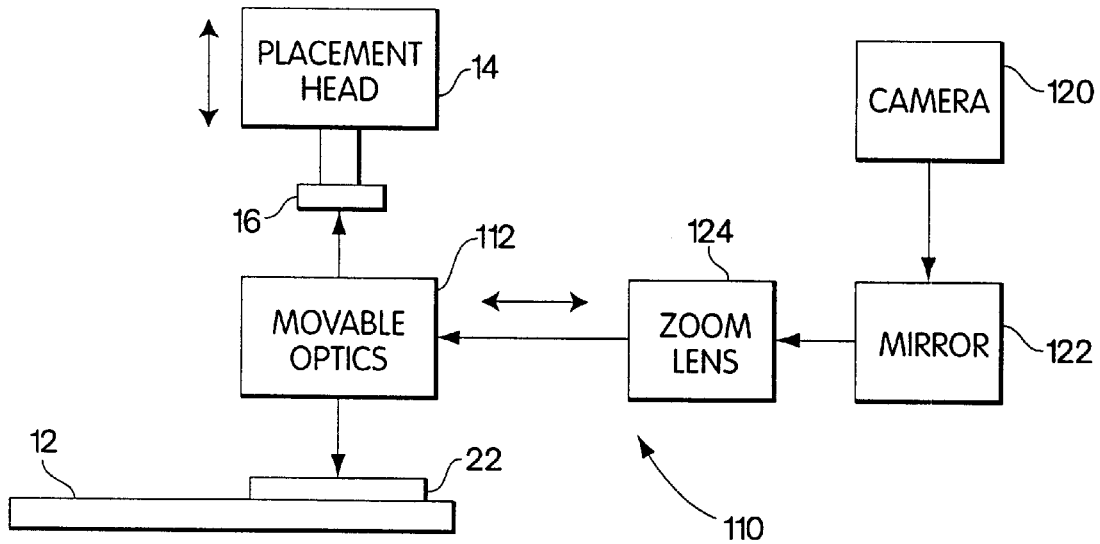
FIG. 7 is a simplified block diagram showing the placement head in an alignment position and the movable optics in an operating position.
Figure 8:
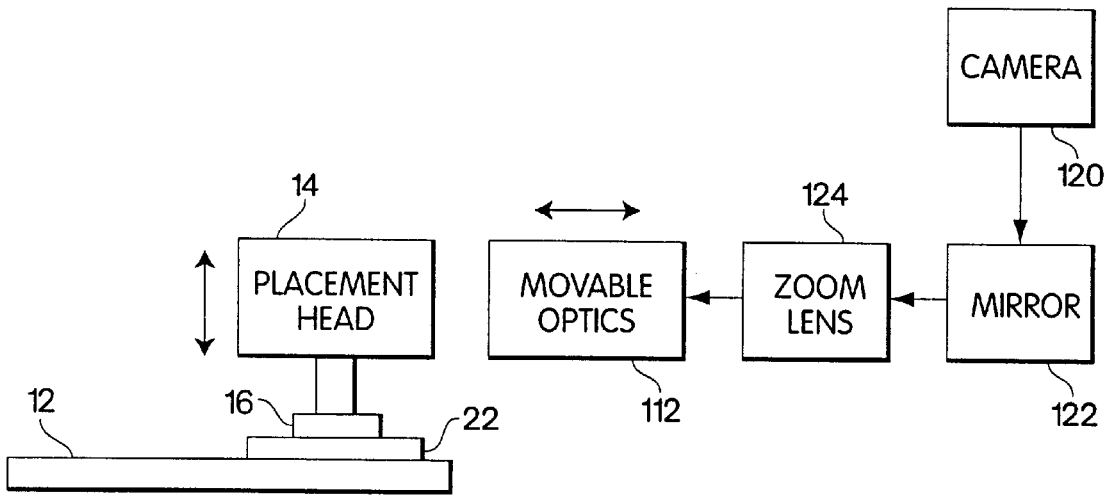
FIG. 8 is a simplified block diagram showing the placement head in a placement position and the movable optics in a retracted position.

The positions of the system elements during alignment and placement are illustrated in the simplified block diagrams of FIGS. 7 and 8. In FIG. 7, the placement head 14 is in the alignment position, and the movable optics 112 is in an operating position between component 16 and placement site 22. In the positions shown in FIG. 7, the camera 120 obtains images of component 16 and placement site 22 in sequence, and the images are processed by image processor 48 (FIG. 4) to determine the relative position error. Then, the position error is corrected by displacing component 16 as required in X and Y directions and rotating component 16 by an angle θ about an axis that is parallel to the Z-axis. Referring now to FIG. 8, the movable optics 112 is retracted from the operating position shown in FIG. 7 to a retracted position. In the retracted position, placement head 14 is free to move downwardly to place component 16 on placement site 22. The placement head 14 is moved downwardly from the alignment position shown in FIG. 7 to a placement position shown in FIG. 8, and the component 16 is placed on placement site 22. It is noted that the camera 120, mirrors 114 and 122 and zoom lens 124 are not moved relative to placement head 14. The operation of the embodiment shown in FIG. 1 is similar to that illustrated in FIGS. 7 and 8, except that alignment optics 46, including camera 50, moves between the operating position and the retracted position.

Figure 9:
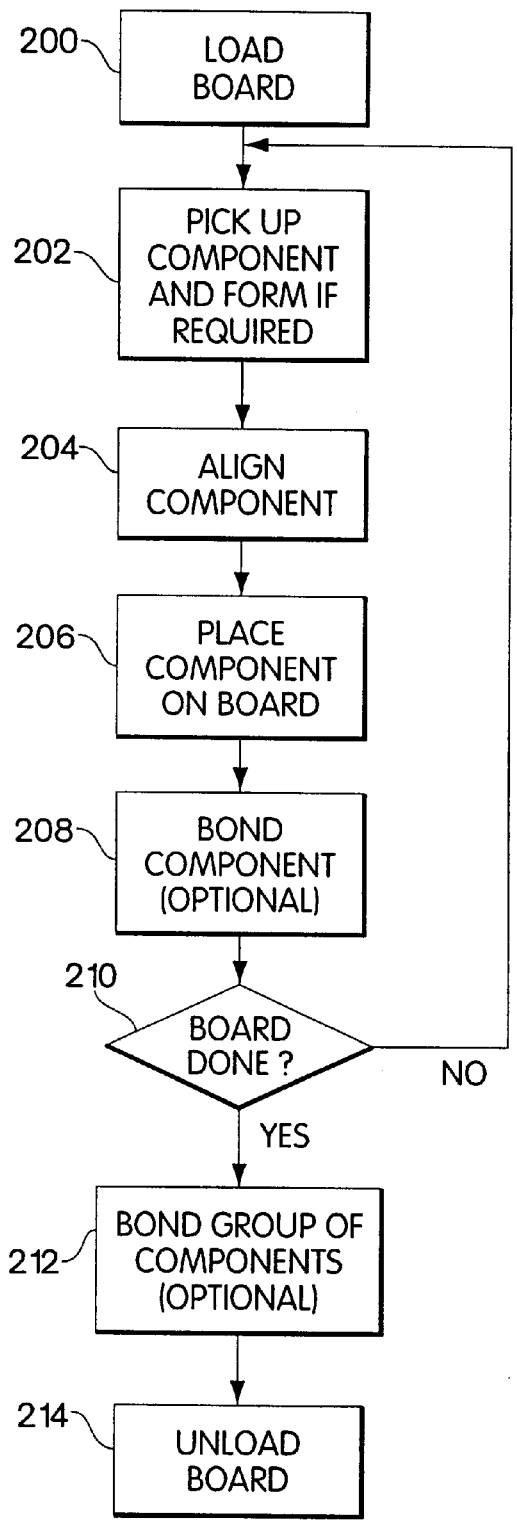
FIG. 9 is a flow diagram showing the operations performed by the automated component placement system.

A flow diagram that illustrates the operation of the automated component placement system of the invention is shown in FIG. 9. The operation is described with reference to the embodiment of FIG. 4. It will be understood that the operation of the embodiment of FIG. 1 is very similar, with appropriate changes to accommodate the different configuration of the alignment optics. In step 200, printed circuit board 12 is loaded onto table 10 by board loading and unloading system 30. It will be understood that the board 12 may be part of a panel containing several printed boards. In step 202, the placement head 14 picks up component 16 from the component loading system 34 and forms the component leads, if required by system operation. It will be understood that the automated component placement system may include a lead forming assembly, which forms the component leads into a desired shape. In step 204, the component is aligned for placement on placement site 22. The alignment operation is described in detail below. In step 206, the accurately aligned component 16 is placed on placement site 22, and the component may be bonded to printed circuit board 12 in step 208. As indicated above, the component bonding operation may be performed in one of several ways. Thus, the bonding of an individual component in step 208 is optional. In step 210, a determination is made whether all of the required components have been placed on the printed circuit board 12. If additional components must be placed on the board, the process returns to step 202, and another component is picked up from the component loading system 34. Steps 202, 204, 206 and optional step 208 are repeated for each component. When all required components have been placed on printed circuit board 12, a group of components may be bonded to board 12 in optional step 212. Then, the printed circuit board 12 is unloaded from the system by board loading and unloading system 30 in step 214.

Figure 10:
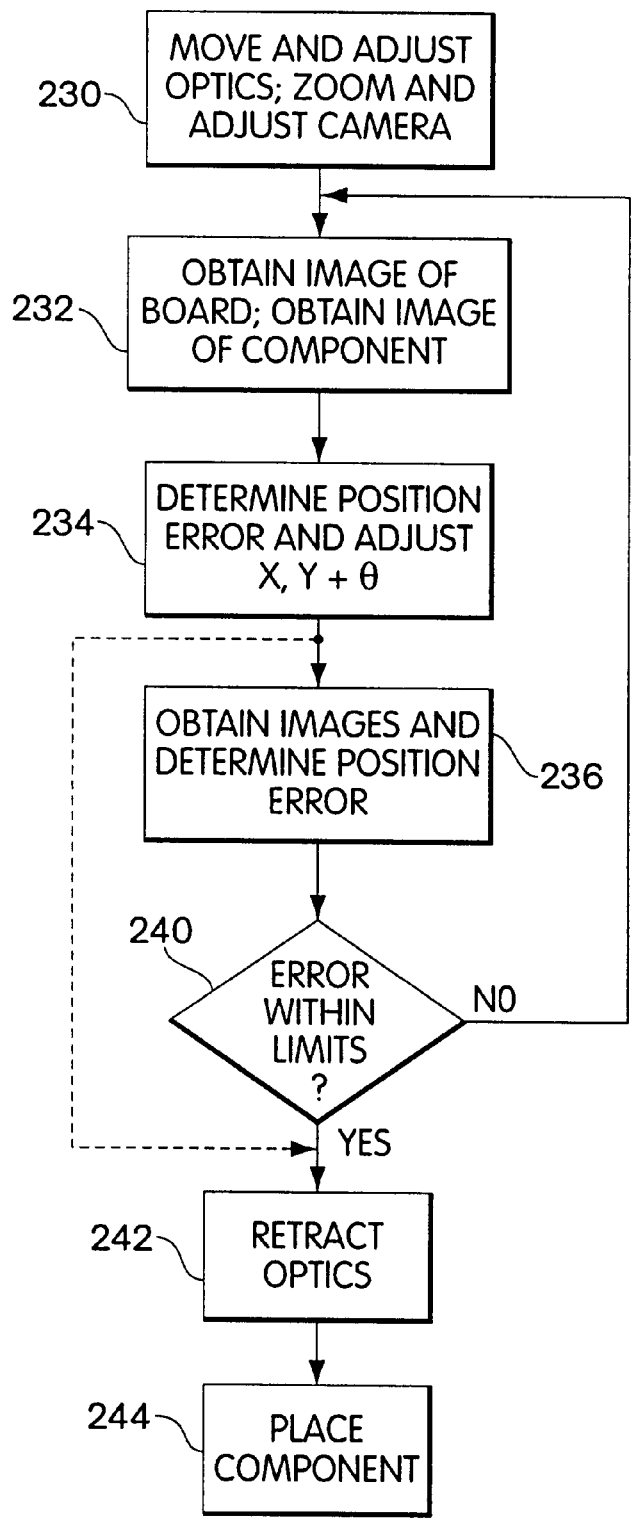
FIG. 10 is a flow diagram showing the operations for aligning a component prior to placement.

A flow diagram of the component alignment process (step 204 in FIG. 9) is shown in FIG. 10. In step 230, the movable portion of the alignment optics is moved into position between placement head 14 and placement site 22 and is adjusted as necessary. In the embodiment of FIG. 4, movable optics 112 is moved into position. In the embodiment of FIG. 1, ailignment optics 46 is moved into position. The movable optics 112, zoom lens 124 and camera 120 are adjusted as necessary to obtain the desired images of component 16 and placement site 22. For example, the lighting unit 62 is energized, and the zoom lens 124 may be adjusted to view a specific region of the component. In step 232, an image of placement site 22 on printed circuit board 12 is obtained, with lighting unit 62 energized and lighting unit 60 deenergized. Then, an image of component 16 is obtained with lighting unit 60 energized and lighting unit 62 deenergized. The image data for the two images is supplied to image processor 48. The image processor 48 analyzes specified regions of the component image, such as specified leads, and a specified region of the placement site, such as pads for receiving the specified component leads, and determines a relative position error between component 16 and placement site 22. The position error includes X and Y displacement errors and θ rotation errors. In step 234, the image processor 48 supplies to head position control 40 control signals which represent X and Y displacements and rotation to eliminate the position error. The head position control 40 displaces and rotates placement head 14 and component 16 in accordance with the control signals. Now the component 16 is properly aligned for placement on printed circuit board 12. In steps 236 and 240, an optional verification procedure may be performed. Second images of the component 16 and the placement site 22 are obtained in step 236, and any residual position errors are determined by the image processor 48. In step 240, a determination is made whether the position error is within prescribed limits. If the position error is still unacceptable, steps 232 and 234 may be repeated. The verification may be repeated as necessary to obtain the desired position accuracy. As indicated above, the verification procedure of steps 236 and 240 may optionally be omitted. Following step 240 or step 234, the movable optics 112 is moved from the operating position (FIGS. 4 and 7) to the retracted position (FIG. 8) in step 242. Then the component 16 is placed on the placement site 22 in step 244 by moving placement head 14 to the placement position shown in FIG. 8 and releasing the component from the placement head 14.

The image processor is used to recognize key features on the component and on the placement site. The objective generally is to align leads or bumps (electrical contacts) on the component with the appropriate contacts or pads on the board. These features are recognized by utilizing one or more commonly used image processing techniques, such as edge detection, normalized correlation or blob analysis. In addition to measurements rendered by these techniques, information about the component or placement site, such as lead or bump geometry, spacing and approximate expected location in the field of view, can be used to determine the reliability of the measurement of any given feature or group of features. If the measurements do not sufficiently meet expectations, they may be excluded from the alignment calculations. Alternatively, placement of the component may be automatically aborted if the measurements of the component or the placement site do not sufficiently meet expectations.

In instances where the leads, bumps or pads cannot be reliably discerned, reference features with a known relationship to the leads, bumps or pads can be used. The position of the component relative to the placement site in the field of view is calculated, and appropriate correction is applied, including machine offset.

Figure 11A:
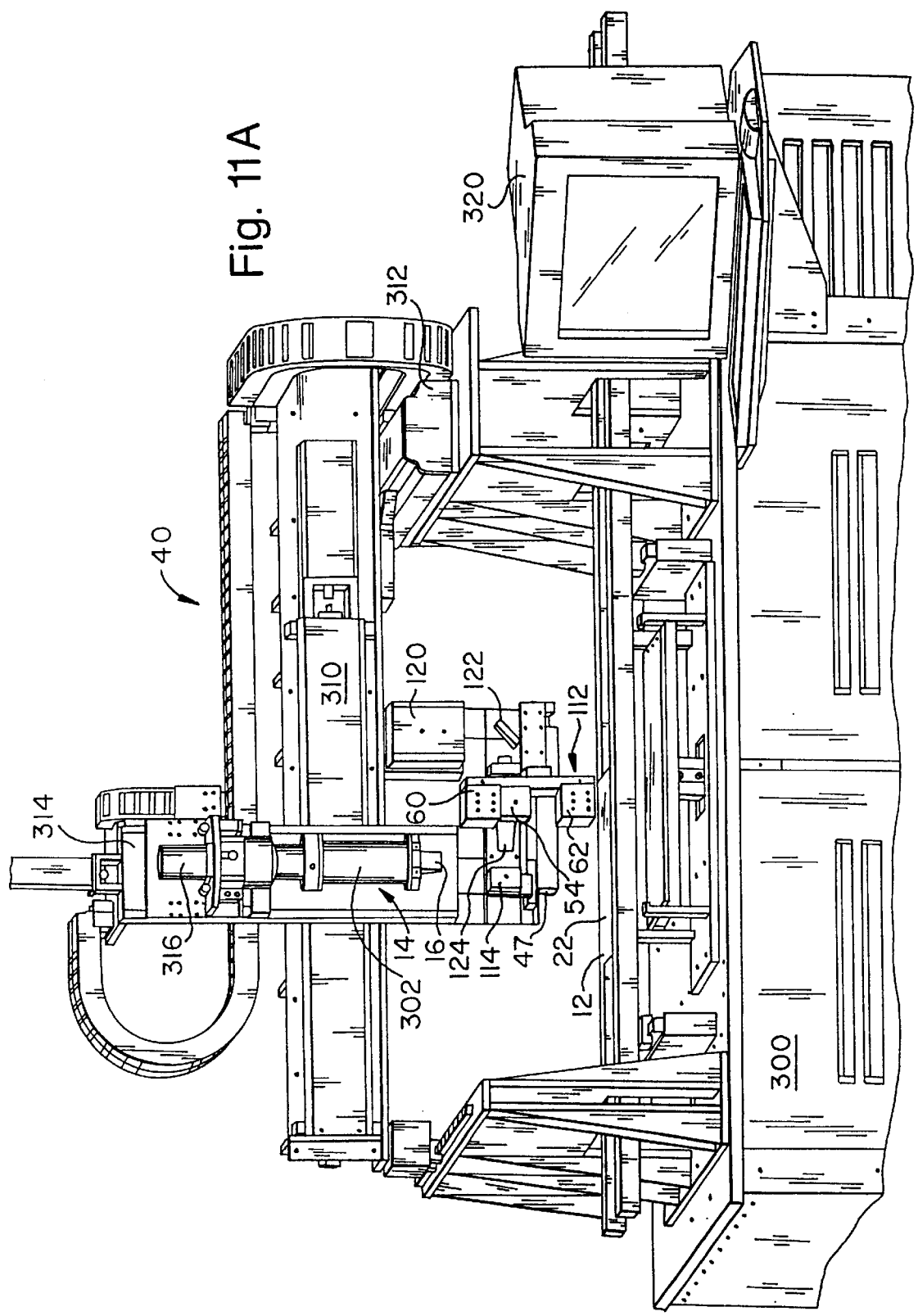
FIG. 11A illustrates an example of an automated component placement system in accordance with the invention, with the movable optics in the retracted position.
Figure 11B:
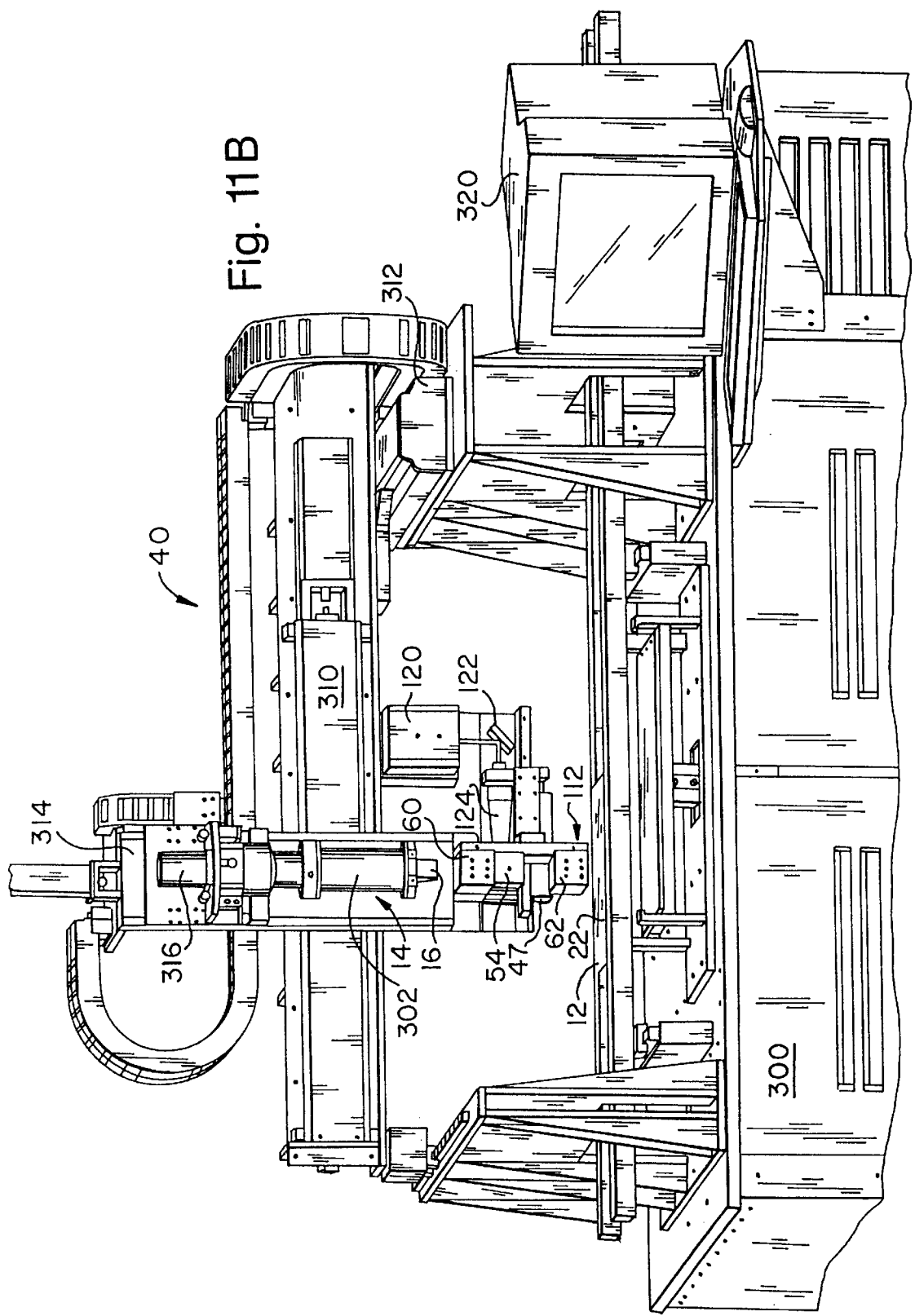
FIG. 11B shows the automated component placement system of FIG. 11A with the movable optics in the operating position.

An example of an implementation of an automated component placement system corresponding to the system of FIG. 4 is shown in FIGS. 11A and 11B. Like elements in FIGS. 4, 5, 11A and 11B have the same reference numerals. The major components of the system are mounted on a suitable cabinet 300. The movable optics 112 is shown in the operating position in FIG. 11B and is shown in the retracted position in FIG. 11A. The placement head 14 includes a bonding device 302. The head position control 40 includes an X axis actuator 310, a Y axis actuator 312, a Z axis actuator 314, and a rotary actuator 316 for rotating component 16 about a vertical axis. The X axis actuator 310, the Y axis actuator 312, and the rotary actuator 316 are used for correcting position errors of component 16 relative to placement site 22. The Z axis actuator 314 is used for moving placement head 14 between the alignment position and the placement position. The system may further include a computer terminal 320 coupled to system controller 44 (FIG. 4) to permit operator control of the system.

Figure 12A:
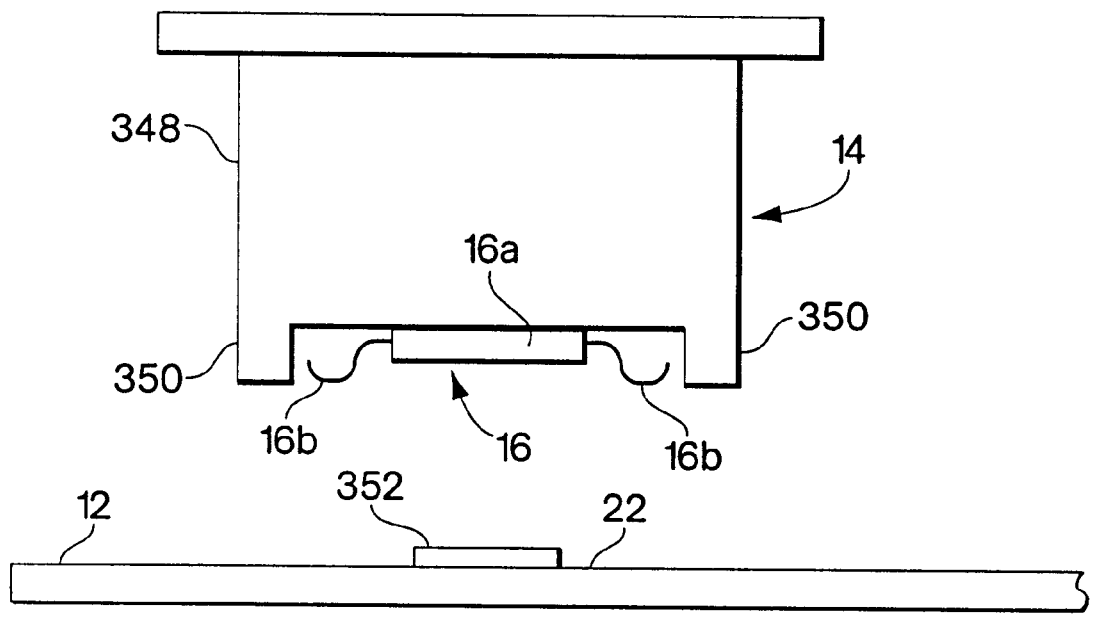
FIG. 12A is an enlarged schematic view of the placement head positioned above the printed circuit board.
Figure 12B:
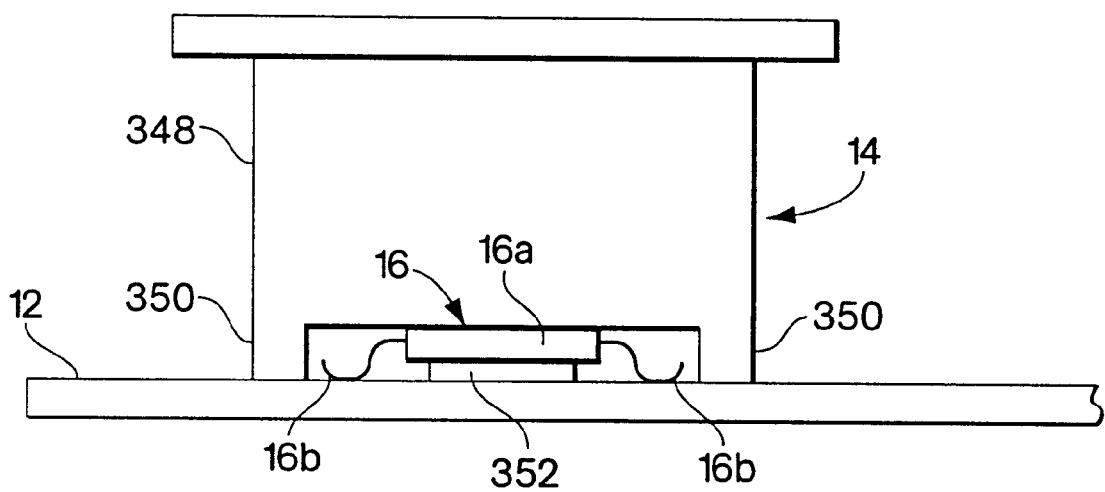
FIG. 12B is an enlarged schematic view of the placement head in the placement position on the printed circuit board.

An enlarged schematic view of the placement head 14 is shown in FIGS. 12A and 12B. In FIG. 12A the placement head 14 is positioned above printed circuit board 12. In FIG. 12B the placement head 14 is in the placement position on printed circuit board 12. Component 16 is held on placement head 14 by a vacuum pickup device until the placement head 14 reaches the placement site 22 and the component 16 is released. The component 16 includes die 16a and formed leads 16b. In the preferred embodiment, placement head 14 includes a nozzle 348 having mechanical stops 350 which extend downwardly from nozzle 348 at several points around component 16. The length of mechanical stops 350 in the vertical direction (parallel to the Z axis) is selected to position component 16 with die 16a spaced above board 12 by a predetermined distance and formed leads 16b slightly flexed. A thermal compound 352 may be placed on placement site 22 beneath component 16 to bond die 16a to board 12.

The optional bonding device in the placement head 14 heats the board 12 in the region of formed leads 16b for solder reflow or for curing of a conductive epoxy. The heat also cures the thermal compound 352. Thus, the placement head structure shown in FIGS. 12A and 12B applies both heat and pressure to the component 16 at the placement site 22. The pressure is established by the relative dimensions of the mechanical stops 350 and the formed leads 16b. The pressure is applied to the component 16 as the component is bonded to board 12. The mechanical stops 350 establish a controlled height of die 16a above board 12. It will be understood that the mechanical stops 350 may have different dimensions for different package types and for different applications. Thus, the component 16 is placed on board 12 with high accuracy and is bonded to board 12 in a highly controlled and repeatable manner.

It will be understood that numerous variations of the automated component placement system are included within the scope of the present invention. For example, the relative position error between the component and the placement site may be corrected by movement of the table 10 or by a combination of movement of placement head 14 and table 10. More particularly, the relative position error may be corrected displacing the board 12 in X and Y directions parallel to the plane of the board and by rotating the board 12 about an axis perpendicular to the plane of the board. The alignment optics may be mounted independently of the placement head or may be mounted to the placement head. A variety of different light sources may be utilized for illumination of component 16 and placement site 22.

The automated component placement system of the invention may be utilized for placement of any component, but has primary utility for placing integrated circuit devices with high lead density and small lead pitch. Examples of integrated circuit packages that may be placed withy the automated component placement system of the present invention include leaded packages such as tape automated bonding (TAB) packages, quad flat pack (QFP) packages and leaded ceramic carrier (LCC) packages, and area array packages such as flip chip packages, area array tape automated bonding (ATAB) packages, ball grid array (BGA) packages, micro BGA packages, column grid array (CGA) packages and ceramic BGA packages.

While there have been shown and described what are at present considered the preferred embodiments of the present invention, it will be obvious to those skilled in the art that various changes and modifications may be made therein without departing from the scope of the invention as defined by the appended claims.

What is claimed is:

1. Component placement apparatus comprising:

a table for holding a board having a placement site;

a placement head for holding a component to be placed on said placement site, said placement head being movable between an alignment position and a placement position;

an alignment assembly for obtaining a first image of said component on said placement head and a second image of said placement site, for processing said first and second images to determine a relative position error between said component and said placement site and for providing a control signal representative of said position error, wherein a portion of said alignment assembly is positioned between the component on said placement head and said placement site when said first and second images are obtained and wherein said first and second images are obtained in opposite directions relative to said portion of said alignment assembly;

a first actuator for causing relative movement between said placement head and said placement site in response to said control signal so as to correct said position error; and a second actuator for moving said placement head between said alignment position and said placement position.

2. Component placement apparatus as defined in claim 1 wherein said alignment assembly comprises alignment optics for obtaining said first and second images, an optics position controller for moving at least a portion of said alignment optics between an operating position and a retracted position, and an image processor for processing said first and second images and determining said position error.

3. Component placement apparatus as defined in claim 2 wherein said alignment optics comprises a camera for obtaining said first and second images, a beam splitter for permitting said camera to view said placement site and said component, a first lighting unit for illuminating said component and a second lighting unit for illuminating said placement site.

4. Component placement apparatus as defined in claim 3 wherein said first and second lighting units each comprise a light source for generating a light beam, a diffuser for diffusing said light beam, and a beam splitter for directing the diffused light beam along a camera viewing path.

5. Component placement apparatus as defined in claim 3 wherein said first and second lighting units each comprise a light source for directing a light beam at an acute angle with respect to a surface of said component or said placement site.

6. Component placement apparatus as defined in claim 2 wherein said placement head is positioned above said placement site in said alignment position and wherein said alignment optics is positioned between said placement head and said table in said operating position.

7. Component placement apparatus as defined in claim 2 wherein said alignment optics comprises a camera for obtaining said first and second images, a zoom lens for varying a field of view of said camera, a beam splitter for permitting said camera to view said placement site and said component, a first lighting unit for illuminating said component and a second lighting unit for illuminating said placement site.

8. Component placement apparatus as defined in claim 7 wherein said beam splitter and said first and second lighting units constitute movable optics movable between said operating position and said retracted position.

9. Component placement apparatus as defined in claim 2 wherein said alignment optics and said optics position controller are mounted to and movable with said placement head.

10. Component placement apparatus as defined in claim 2 wherein said alignment optics comprises a single video camera for obtaining said first and second images in sequence.

11. Component placement apparatus as defined in claim 2 wherein said image processor further includes means for verifying alignment of said component relative to said placement site following correction of said position error by obtaining additional images of said component and said placement site and determining from said additional images the position error between said component and said placement site.

12. Component placement apparatus as defined in claim 1 wherein said placement head further includes a bonding device for bonding said component to said board.

13. Component placement apparatus as defined in claim 12 wherein said bonding device includes means for directing a heated gas toward said component for bonding.

14. Component placement apparatus as defined in claim 12 wherein said bonding device includes means for generating infrared energy for bonding said component to said board.

15. Component placement apparatus as defined in claim 12 wherein said bonding device includes means for contact heating of said component.

16. Component placement apparatus as defined in claim 12 wherein said bonding device includes means for bonding a group of components simultaneously.

17. Component placement apparatus as defined in claim 12 wherein said bonding device includes means for bonding a single component.

18. Component placement apparatus as defined in claim 1 wherein said first actuator includes means for moving said placement head in X and Y directions parallel to a plane of said board and for rotating said placement head about an axis perpendicular to the plane of said board for alignment of said component with said placement site.

19. Component placement apparatus as defined in claim 1 wherein said first actuator includes means for moving said board in X and Y directions parallel to a plane of said board and for rotating said board about an axis perpendicular to the plane of said board for alignment of said component with said placement site.

20. Component placement apparatus as defined in claim 1 further comprising a component loading assembly for loading said component into said placement head.

21. Component placement apparatus as defined in claim 1 further comprising a board loading and unloading assembly for loading said board onto said table for placement of said component and for unloading said board from said table after placement of said component.

22. Component placement apparatus as defined in claim 1 wherein said placement head includes a vacuum pickup device for holding said component.

23. Component placement apparatus as defined in claim 1 wherein said alignment assembly comprises first alignment optics for obtaining said first image of a first viewing region of said component and for obtaining said second image of a corresponding first viewing region of said placement site, a first optics position controller for moving at least a portion of said first alignment optics between an operating position and a retracted position, second alignment optics for obtaining said first image of a second viewing region of said component and said second image of a corresponding second viewing region of said placement site, a second optics position controller for moving at least a portion of said second alignment optics between an operating position and a retracted position, and an image processor for processing the first and second images provided by each of said first and second alignment optics and determining said position error.

24. A method for accurately placing a component on a board having a placement site for the component, comprising the steps of:

loading the board onto a table;

holding the component with a placement head that is movable between an alignment position and a placement position;

positioning a portion of an alignment assembly between the component on said placement head and said placement site;

obtaining a first image of said component on said placement head;

obtaining a second image of said placement site, wherein first and second images are obtained in opposite directions relative to said portion of said alignment assembly;

processing said first and second images to determine a relative position error between said component and said placement site;

providing a control signal representative of said position error;

causing relative movement between said placement head and said placement site in response to said control signal so as to correct said position error;

moving said placement head between said alignment position and said placement position; and releasing said component from said placement head.

25. A method as defined in claim 24 wherein the step of obtaining a first image of said component includes illuminating said component with a first light source and obtaining the first image of said component with a video camera, and wherein the step of obtaining a second image of said placement site includes illuminating said placement site with a second light source and obtaining an image of said placement site with said video camera.

26. A method as defined in claim 24 wherein the step of processing said first and second images comprises processing the first and second images obtained by said video camera with an electronic image processor.

27. A method as defined in claim 24 wherein the step of causing relative movement includes displacing said placement head in a plane parallel to a plane of said board and rotating said placement head about an axis perpendicular to the plane of said board.

28. A method as defined in claim 24 further including the step of bonding said component to said placement site.

29. A method as defined in claim 28 wherein the step of bonding said component comprises bonding a group of components to said board simultaneously.

30. A method as defined in claim 28 wherein the step of bonding said component includes bonding a single component to said placement site.

31. Component placement apparatus comprising:

a table for holding a board having a placement site;

a placement head for holding a component to be placed on said placement site, said placement head being movable between an alignment position and a placement position;

alignment optics for obtaining a first image of said component on said placement head and a second image of said placement site, wherein a portion of said alignment optics is positioned between the component on said placement head and said placement site when said first and second images are obtained and wherein said first and second images are obtained in opposite directions relative to said portion of said alignment optics;

an optics position controller for moving said portion of said alignment optics between an operating position and a retracted position;

an image processor for processing said first and second images and determining a relative position error between said component and said placement site and for providing a control signal representative of said position error;

a first actuator for causing relative movement between said placement head and said placement site in response to said control signal so as to correct said position error; and a second actuator for moving said placement head between said alignment position and said placement position.

32. Component placement apparatus as defined in claim 31 wherein said alignment optics and said optics position controller are mounted to placement head and move with said placement head.

33. Component placement apparatus as defined in claim 31 wherein said image processor further comprises means for verifying the alignment of said component relative to said placement site after correction of said position error.

34. Component placement apparatus as defined in claim 31 wherein said placement head further includes a bonding device for bonding said component to said board.

35. Component placement apparatus as defined in claim 34 wherein said bonding device includes means for bonding a group of components to said board simultaneously.

36. Component placement apparatus as defined in claim 31 wherein said first actuator includes means for moving said placement head in X and Y directions parallel to a plane of said board and for rotating said placement head about an axis perpendicular to the plane of said board for alignment of said component with said placement site.

37. Component placement apparatus as defined in claim 31 wherein said first actuator includes means for moving said board in X and Y directions parallel to a plane of said board and for rotating said board about an axis perpendicular to the plane of said board for alignment of said component with said placement site.

38. Component placement apparatus as defined in claim 31 wherein said component includes a die and formed leads and wherein said placement head includes position control means for placing said component with said die spaced from said board by a predetermined distance.

39. Component placement apparatus as defined in claim 38 wherein said placement head includes a nozzle for holding said component and wherein said position control means comprises one or more mechanical stops extending from said nozzle toward said board.

* * * * *